United States Patent [19]

Sablik et al.

[11] Patent Number: 5,114,914
[45] Date of Patent: May 19, 1992

[54] FABRICATION OF HIGH TEMPERATURE SUPERCONDUCTORS

[75] Inventors: Martin J. Sablik; Colin I. Nicholls, both of San Antonio; Robert E. Anderson, San Marcos, all of Tex.

[73] Assignee: Southwest Research Institute, San Antonio, Tex.

[21] Appl. No.: 337,362

[22] Filed: Mar. 13, 1989

[51] Int. Cl.$^5$ ............................................. B05D 5/12
[52] U.S. Cl. ........................................ 505/1; 505/709; 505/740; 505/741; 505/742; 427/62; 427/376.2
[58] Field of Search ............... 505/1, 701, 704, 729, 505/733, 739, 740, 741, 742; 427/376.2, 62, 63

[56] References Cited

FOREIGN PATENT DOCUMENTS 63-242923 10/1988 Japan ....................................... 505/1
63-281319 11/1988 Japan ....................................... 505/1

OTHER PUBLICATIONS

Sadakate et al, MRS Symposium on High Temp. Superconductors, Nov. 30–Dec. 4, 1987, pp. 293–296.
McCallum et al., Advanced Ceramic Materials, vol. 2, No. 3B, Special Issue, Jul. 1987, pp. 388–400.
M. K. Wu, J. R. Ashburn, C. J. Torng, P. H. Hor, R. L. Meng, L. Gao, A. J. Huang, Y. Q. Wang and C. W. Chu, "Superconductivity at 93K in a New Mixed–Phase Y–Ba–Cu–O Compound System at Ambient Pressure", Physical Review Letters, vol. 58, p. 908, Mar. 2, 1987.
S. Jin, R. C. Sherwood, T. H. Tiefel, R. B. Vandover, R. A. Fastnacht, and M. E. Davis, "Processing for High Critical Currents in YBa$_2$Cu$_3$O$_{7-o}$", High-Temperature Superconductors II, Extended Abstracts EA-14 (Materials Research Society) Pittsburgh, Pa., 1988, p. 153.
D. W. Murphy, D. W. Johnson, Jr., S. Jin, R. E. Howard, "Processing Techniques for the 93K Superconductor Ba$_2$YCu$_3$O$_7$" Science, vol. 241, p. 922, Aug. 19, 1988.
M. F. Yan, H. C. Ling, H. M. O'Bryan, P. K. Gallaher, and W. W. Rhodes, "Process-Related Problems of YBa$_2$Cu$_3$O$_x$ Superconductors", Materials Science and Engineering B1 (1988), 1191 ∝ 129.
T. H. Tiefel, S. Jin, R. C. Sherwood, Gr. B. Van Dover, R. A. Fastnacht, M. E. Davis, D. W. Johnson, Jr. and W. W. Rhodes, "Fabrication and Properties of High –T$_c$ Superconducting Wires", J. Appl. Phys. 64(10), 5896, Nov. 15, 1988.
J. W. Halloran, presentation at Int. Supercond. Applic. Conf. SC Global '89, San Francisco, Calif., Jan. 1989.
N. McN.Alford, presentation at Int. Supercond. Applic. Conf., SC Global '89 San Francisco, Calif., Jan. 1989.
S. Jin., T. H. Tiefel, R. C. Sherwood, R. B. Van Dover, M. E. Davis, G. W. Kammlott, and R. A. Fastnacht, "Melt-Textured Growth of Polycrystalline . . . ", American Physical Society, vol. 37, May 1, 1988, 7850.
S. Jin, T. H. Tiefel, R. C. Sherwood, M. E. Davis, R. B. Van Dover, G. W. Kammlott, R. A. Fastnacht, and H. D. Keith, "High Critical Currents in Y–Ba–Cu–O Superconductors", Appl. Phys. Letter, vol. 52, p. 2074, Jun. 13, 1988.
S. Jin, private communication.
C. X. Qui and I Shih, "Some Properties of Bulk Y–Ba–Cu–O Compounds Containing SiO$_2$", J. Appl. Phys. 64(4), Aug. 15, 1988, p. 2234.
M. F. Yan, W. W. Rhodes, and P. K. Gallagher, "Dopant Effects on the Superconductivity of YBa$_2$Cu$_3$O$_7$–Ceramics", J. Appl. Phys. 63, 821, Feb. 1, 1988.
A. T. Fiory, S. Martin, L. F. Schneemeyer, R. M. Flemming, A. E. White and J. V. Waszczak, "Oxygen Intercalation Homogeneity and Electrical Transport in Superconductinve Ba$_2$YCu$_3$O$_7$–Crystals", Physical Review, V3, No. 10, p. 7129, Oct. 1, 1988.
G. S. Grader, H. M. O'Bryan and W. W. Rhodes, "Improved Press Forging of Ba$_2$YCu$_3$O$_x$ Superconductor", Appl. Phys. Lett 52, 1831, May 23, 1988.

Primary Examiner—Norman Morgenstern
Assistant Examiner—Margaret Bueker
Attorney, Agent, or Firm—Sigalos, Levine & Montgomery

[57] ABSTRACT

An improved method for producing high temperature superconductors comprising sintering ceramic superconductor material in a sealed confinement chamber made of non-reactive impervious material, thereby preventing loss of oxygen from the material during heating and eliminating the need for reoxygenation after sintering.

16 Claims, 4 Drawing Sheets

FABRICATION OF HIGH TEMPERATURE SUPERCONDUCTORS

BACKGROUND OF THE INVENTION

This invention relates to superconductors and more particularly to those that are referred to as "high temperature superconductors".

High temperature superconductors are known in the art, illustrative of which are those described in co-pending U.S. patent application Ser. No. 07/158,345 filed on Feb. 22, 1988 by Martin John Sablik.

Among high temperature superconductors are several which are formed of a ceramic oxide, such as yttrium-barium-copper oxide. Although such high temperature ceramic oxide superconductors comprise a substantial step forward in the art, there have been problems in producing them. Typically, in the prior art, these high temperature superconductors have been fabricated by the so-called "shake" and "bake" method, according to which the metal oxide ingredients are ground together, compressed and then sintered in an oxygen atmosphere at elevated temperatures near the melting point. The elements react chemically to form the superconducting compound and fuse into a solid. However, it is known that oxygen is highly reactive in such a highly heated environment; and it is also known that in the absence of an oxygen rich atmosphere, some of the oxygen that is chemically bound to the other elements disassociates itself and migrates away, thus tending to destroy or degrade the superconducting properties of the material.

SUMMARY OF THE INVENTION

In practicing the principles of the invention, the superconducting material is fabricated within a hollow cylinder of essentially non-reacting, oxygen impermeable material which serves to block the loss of oxygen out of the superconducting material. This hollow cylinder which hereinafter is referred to as a confinement tube, is preferably made of silicon carbide with a binder constituent as hereinafter described. The silicon carbide confinement tube may contain ambient air or an oxygen rich atmosphere.

OBJECTS AND FEATURES

It is one general object of this invention to improve manufacture of high-temperature superconductors.

It is another object of this invention to minimize the oxygen disassociation from ceramic oxide superconductors during the processing thereof.

It is yet another object of the invention to process high-temperature ceramic oxide superconductors in an environment that is non-reactive and which facilitates bulk texturing of the super-conducting material.

Accordingly, in accordance with one feature of the invention, through the efficacious use of silicon carbide, the material of the containment tube is non-reactive with the superconducting material ingredients, thereby facilitating processing at the aforementioned sintering temperature.

In accordance with another feature of the invention, through the utilization of the aforementioned confinement tube, the superconducting material can be melt-textured while eliminating or reducing the need for subsequent oxygenation, and encouraging cystallites to grow in the melt-textured bulk along the principal axis of the confinement tube and in the direction of thermal gradient.

It is another object of the invention to form thin or thick films on silicon carbide substrates because the substrates are non-reactive with the superconducting material.

These and other objects and features of the invention will be apparent from the following detailed description, by way of examples of a preferred embodiment, with reference to the drawing.

DETAILED DESCRIPTION

Figure 1:
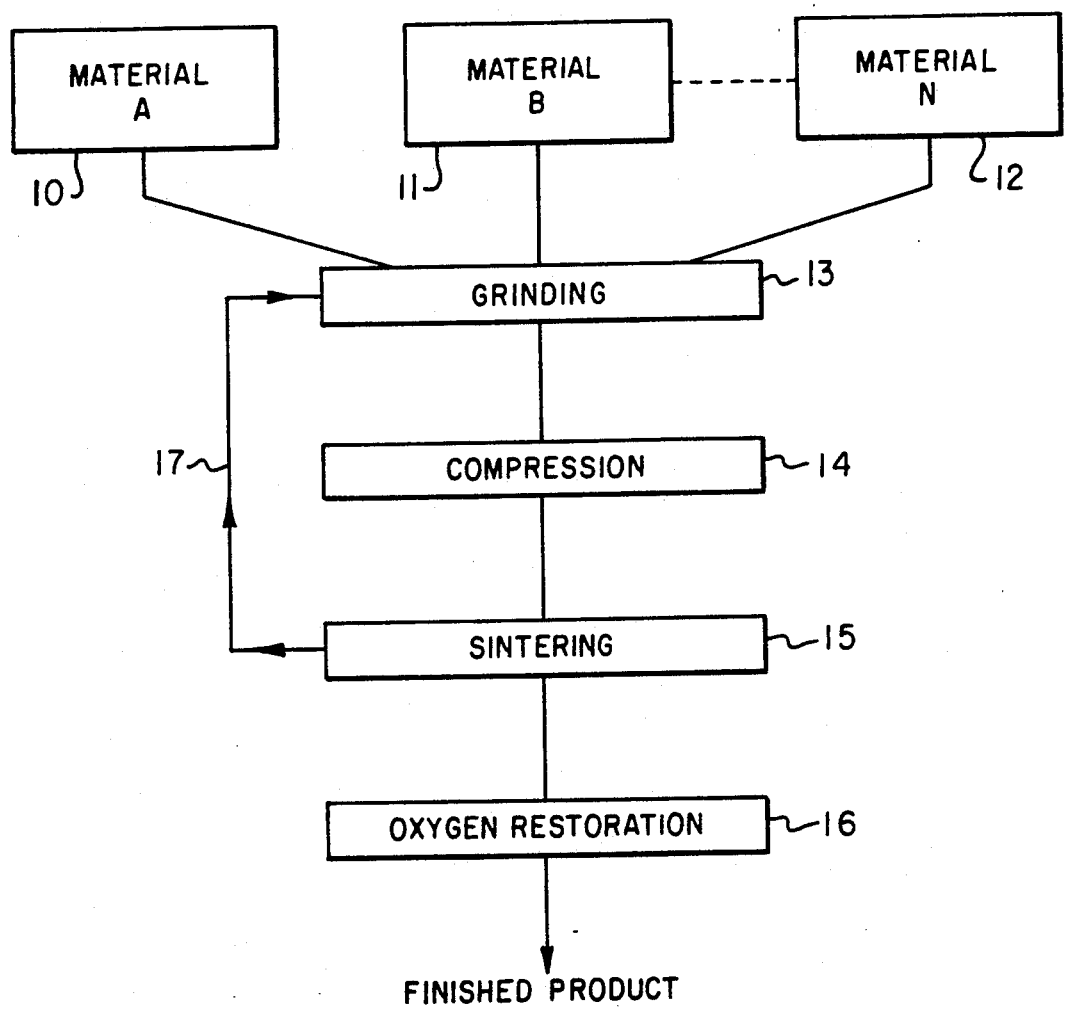
FIG. 1 is a diagram depicting the processing of high temperature ceramic oxide superconductors according to the prior art.

Now turning to the drawings, and more particularly to FIG. 1 thereof, it will be observed that there is disclosed in block diagram form a typical manufacturing process in accordance with heretofore known techniques. In that figure, material A, material B and/or other materials which are represented by the dashed line and the box labelled material "N" are ground and mixed together by introducing them to a suitable conventional grinder 13 where grinding and mixing are conducted. The powders are ground together, pressed into a pellet, and reacted at elevated temperature in the presence of flowing oxygen, and then after cooling in oxygen, ground again, pelletized again, and reacted again in sequence over and over until satisfactory powder of superconducting material is produced. This sequence is represented by return flow path 17.

At the conclusion of the powder preparation, the powder is introduced into press 14 where the materials are compressed into a final pellet. Thereafter, the materials are heated in heater 15 where sintering of the pressed materials occurs, causing them to bind into a cohesive mass.

Unfortunately, during the step of sintering the pressed materials as practiced in the prior art, a substantial amount of the oxygen contained in the superconductor materials is lost, and the materials cannot then become superconducting unless and until the oxygen is reintroduced. Such reintroduction is symbolized by oxygen restoration 16. However, typically such oxygen restoration involves many hours of baking the sintered material at relatively high temperatures in an oxygen atmosphere to effect the required restoration. Typically, the times and temperatures for such oxygen reintroduction are from eight hours to several days at temperatures of several hundred degrees Celsius.

Furthermore, in accordance with the prior art, where thin films of superconducting material are to be prepared, the aforementioned loss of oxygen has been sufficiently severe so as to destroy the superconducting characteristics of the film and thereby require reoxygenation as in the case of the bulk superconductors.

For a thin film superconductor, the attendant increase in time of fabrication is particularly undesirable.

Figure 2:
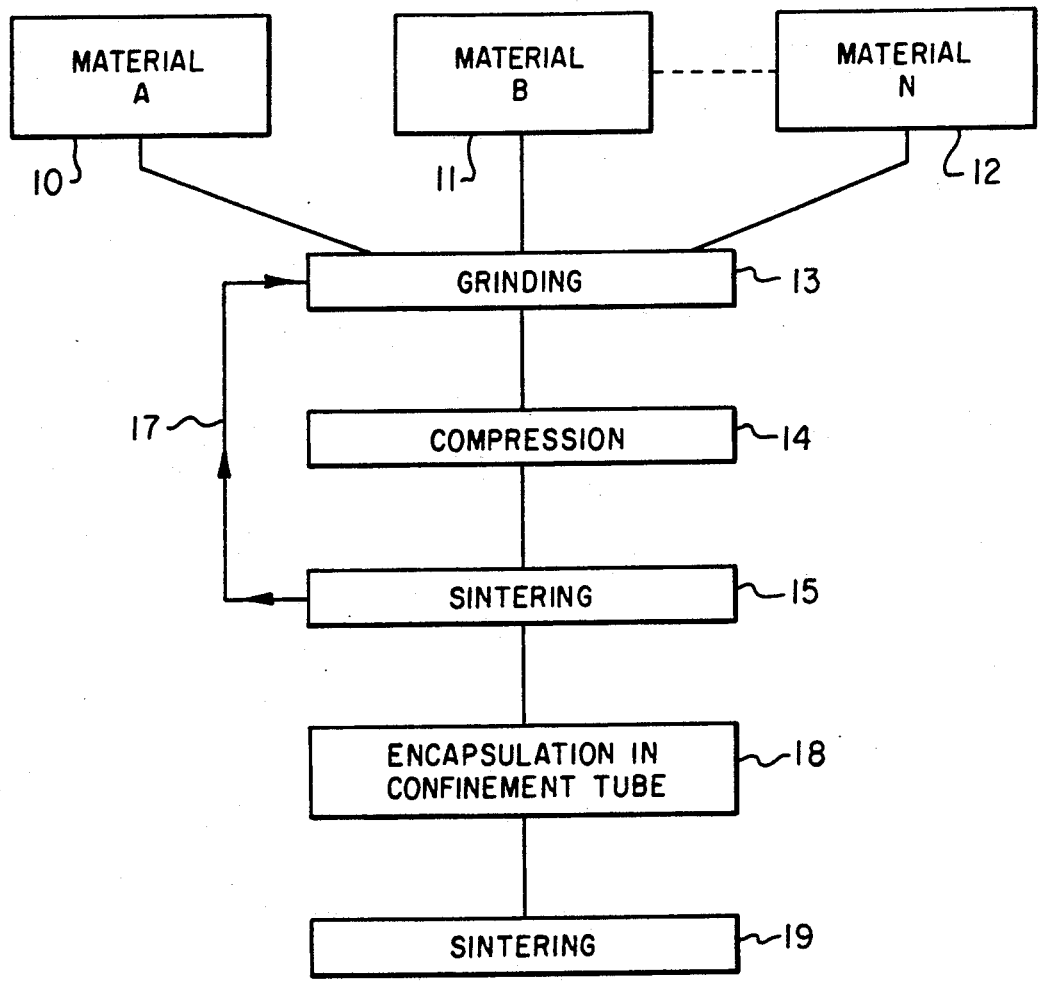
FIG. 2 is a diagram illustrating the processing of high temperature ceramic oxide superconductors in accordance with the principles of the invention.

Now turning to FIG. 2, it will be observed that it discloses a method in accordance with the invention hereof. There, superconducting powder is preformed as in the case of the prior art. However, in contrast with prior art, the powder is packed into a confinement tube 18 with much of the environmental atmosphere being squeezed out during packing. The packing is done in an environment of ambient air or an oxygen rich atmosphere. The confinement tube is then closed and sealed tightly before being heated to achieve sintering as indicated by symbol 19 (FIG. 2). Upon completion of sintering, the encapsulation tube may be opened and the material removed. As mentioned above, in consequence of the material having been enclosed within the confinement tube and since the material of the confinement tube is carefully selected to be non-reactive with the processed material and impermeable to oxygen, the processed material retains its superconductive properties and does not require reoxygenation as with the prior art. Other possible materials to be used in place of silicon carbide may be boron nitride, silicon nitride and tungsten carbide.

Figure 3:
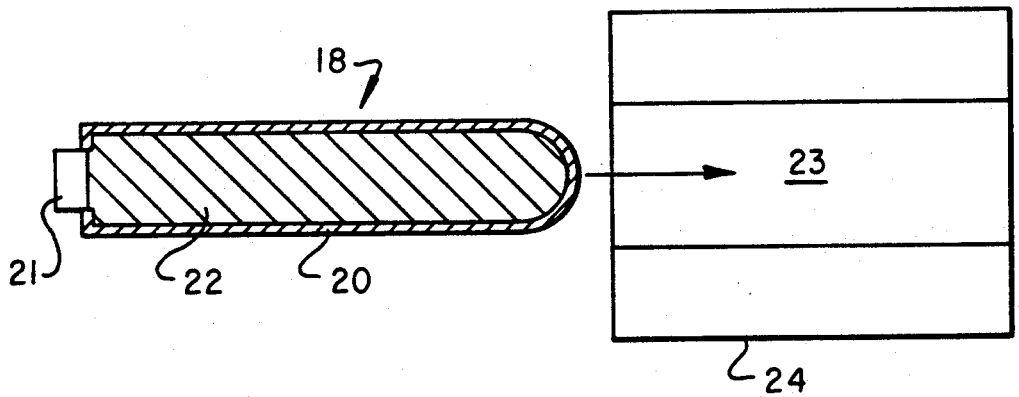
FIG. 3 is a diagram illustrating the preferred form of the confinement tube in accordance with the principles of the invention.

Now turning to FIG. 3, the preferred form of the confinement tube is illustrated. As mentioned above, the walls 20 of the confinement tube 18 are constructed of silicon carbide or any other material which has been found to be non-reactive with ceramic superconductors of the type herein described. In FIG. 3, the various members are shown in cross-section, and thus the walls 20 of confinement tube 18 are illustrated in section. Although the confinement tube preferred for practicing the invention is generally cylindrical, it will be evident to those skilled in the art that other geometric shapes could be employed.

At the left end of the confinement tube as illustrated in FIG. 3, there is shown plug 21 which, after the tube has been filled with material 22, is inserted and sealed tightly. This plug may be made of any suitable material that will withstand the relatively high temperatures of sintering and without reacting with the superconductor material. The preferred material of such plug is also silicon carbide or other non-reactive material, such as suggested previously.

After being filled and sealed, confinement tube 18 is passed into the interior opening 23 of furnace 24 where it is appropriately heated to chemically bind the material ingredients together and to sinter them as is heretofore described. In order to accomplish this, confinement tube 18 may be passed through the heating zone of the furnace 24 very slowly (e.g., progressive zone heating) or it may be placed stationary within the furnace and the entire tube heated uniformly.

One additional advantage accruing from practicing the inventive principles hereof resides in the ease with which the material may be melt textured if desired by increasing the temperature of the furnace and/or by passing a heated zone along the tube.

The principles of the invention will be further understood by reference to the following examples illustrating their use in preparing superconducting materials as described above.

EXAMPLES $YBa_2Cu_3O_{7-x}$ was used as the superconductor powder in this example. The powder used was either obtained from Alrich Chemical Co. or was prepared in our laboratory according to the procedure that follows.

Stoichiometric amounts of $Y_2O_3$, $BaCO_3$, and $CuO$ were ground together in an agate crucible until the color and texture of the mixture was homogeneous. This grinding process took about 15 minutes. Next, the powder mixture was heated for 18 hours at 900° C. in an oxygen atmosphere. The material was then quenched from 900° C. to room temperature by removing it from the furnace. The cooled mixture was then reground in the crucible until a smooth, homogeneous, grayish powder was obtained. Pellets 1-inch thick in diameter and ⅛-inch thick were made in a press under pressure of about 5,000 pounds per square inch. These pellets were then heated in oxygen for six hours at 925° C., quenched to room temperature, placed in a low temperature furnace with an oxygen atmosphere at 550° C. for four hours and then slow-cooled to 350° C. at the rate of 1° per minute. The pellets remained at 350° C. for an additional twelve hours and then were slow-cooled to room temperature at about 1° per minute. The pellets were then reground and new pellets made, which were reheated to 940° C. for six hours in oxygen, and then were slow-cooled to room temperature at about 1° per minute. The pellets were then again reground, new pellets made, and reheated to 940° C. for six hours in oxygen and then again cooled to room temperature at about 1° per minute. This grinding, repelletizing, heating and cooling were then repeated one additional time. It was found that reprocessing the pellets by grinding them, repelletizing, heating, and cooling resulted in an increase in density of the material. After the last firing at 940° C., the pellets were reground once more to produce fine $YBa_2Cu_3O_{7-x}$ powder. Care was then taken to protect the powder from moisture since it was found that the powder would take on water rapidly.

The $YBa_2Cu_3O_{7-x}$ powder was used to pack commercial carbide containment tubes which were obtained commercially. In this example, tubes made of commercial grade silicon carbide with a clay binder were obtained from Bolt Technical Ceramics Company in Conroe, Texas. The silicon carbide tubes used were ¼ inch internal diameter and ½ inch outer diameter. The foregoing silicon carbide tubes were closed at one end. $YBa_2Cu_3O_{7-x}$ powder was added to the open end of the silicon carbide tubes and compacted as it was added. The silicon carbide tubes containing compacted powder were then heated in a horizontal position at 950° C. for between 30 and 45 minutes and then slowly quenched to room temperature. The material was then removed from the silicon carbide tubes and was tested for superconducting properties by measuring its resistance while progressively lowering the temperature to the superconducting region.

Figure 4:
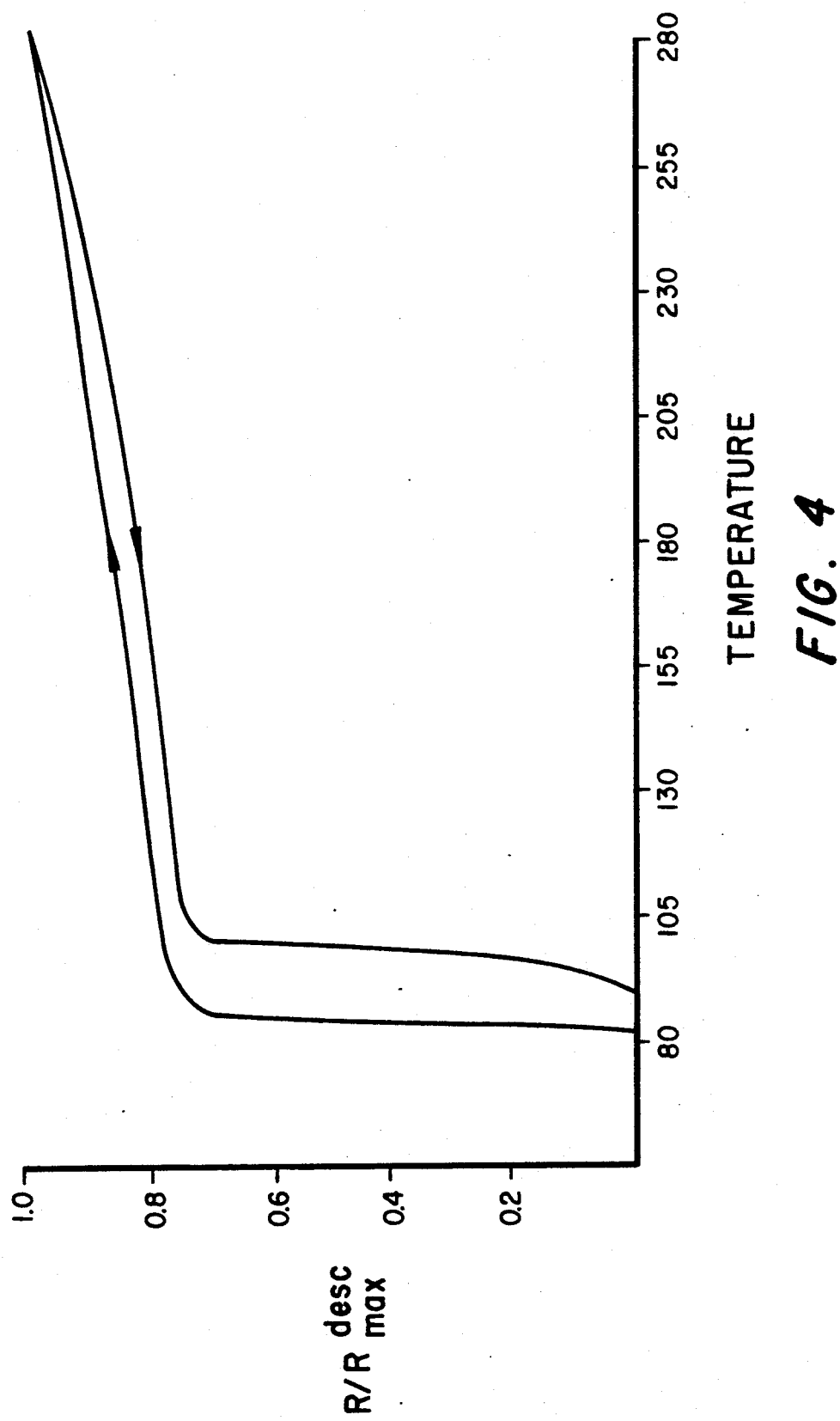
FIGS. 4, and 5 are diagrams depicting the superconducting characteristics of ceramic oxide superconductors prepared in containment tubes via sintering and melt-processing respectively.

FIG. 4 illustrates test results. From an examination of FIG. 4, it will be evident that there is evidence of a superconducting transition. In this instance, superconducting transition temperatures for the cooling and warming curves appear to be different only because the sample was not in thermal equilibrium with the thermocouple during the cooling and warming process. It is clear that the sample, prepared in the confinement tube and quenched without additional reoxygenation, is a good superconductor.

The clay binder in the silicon carbide confinement tube is useful to include because it is believed that the clay binder effectively seals porosity in the silicon carbide thereby effectively sealing it and preventing oxygen from escaping while the material therein is being sintered.

A silicon carbide tube obtained from Lindberg Furnace Company was also used to produce superconducting material without reoxygenation, but in that case, the material produced was not as good, exhibiting a transition temperature step but not zero resistivity below the transition. The silicon carbide tube from Lindberg was somewhat porous and did not serve therefore as an effective barrier for preventing loss of oxygen from the superconducting material.

In a separate experiment, $YBa_2CU_3O_{7-x}$ powder was compacted and sealed inside a silicon carbide tube with clay binder, as obtained from Bolt Technical Ceramics. Applying an oxy-hydrogen torch to the outside of the silicon carbide tube, the powder inside was heated to a temperature above that at which it begins to melt incongruently. Heating was applied to all sides of the silicon carbide tube and the torch elevation was very slowly decreased as time progressed. In this way, the hot zone descended slowly from the top to the bottom of the silicon carbide tube. In all, three zone passes of this type were accomplished over a 3 hour period. The experiment simulates the melt-texturing procedure of the prior art; but in this case, the superconducting material was inside a confinement tube instead of being exposed to the open air.

Figure 5:
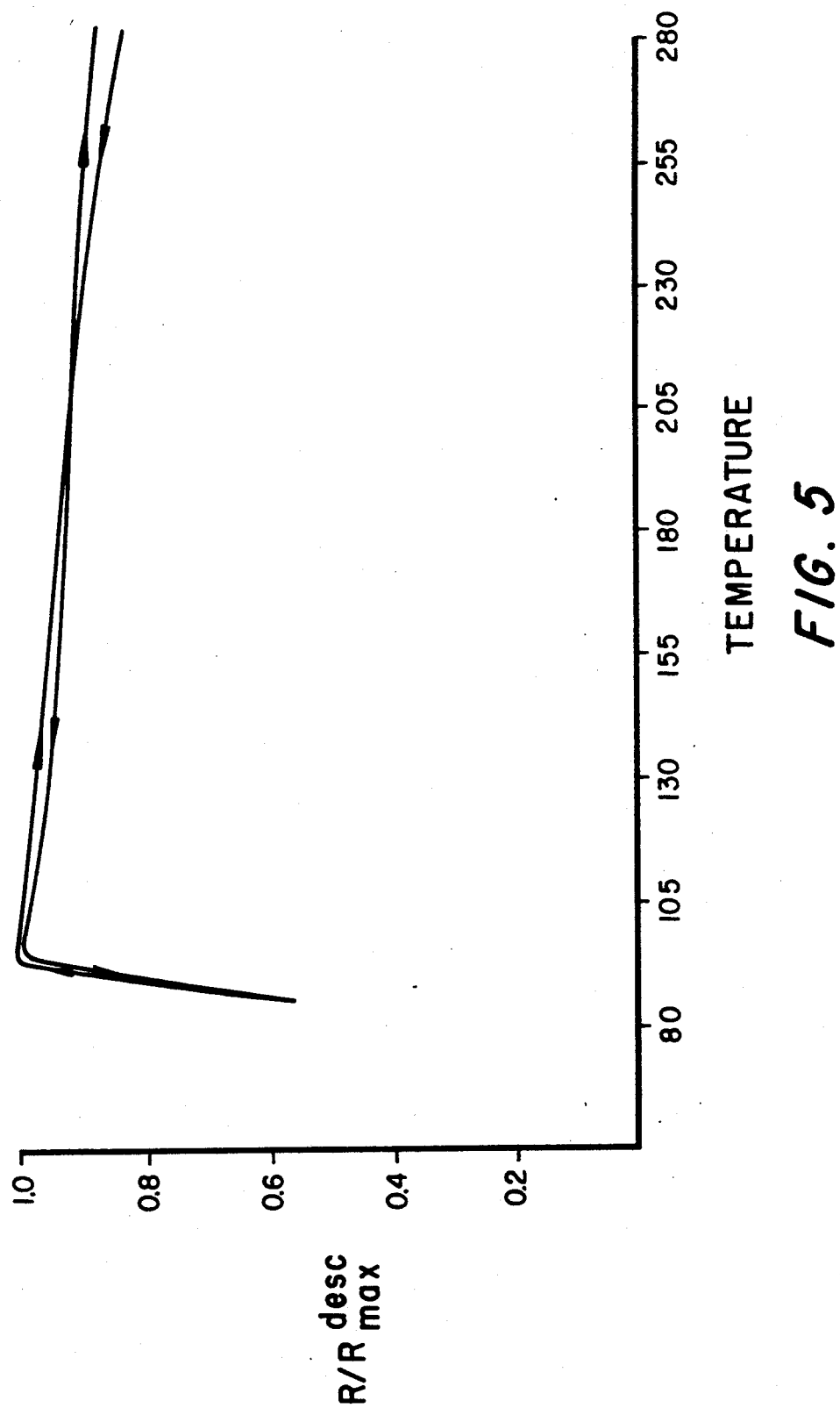

FIG. 5 shows the result of melt-processing. The material exhibits an apparent superconducting transition but the temperature was not reduced to a point where full zero resistivity was obtained. With a more carefully controlled procedure, using for example, an rf heater, it is expected that even better superconducting material can be melt-processed by this confinement procedure without the need for oxygenation afterwards.

It will now be evident that there has been described herein an improvement in the fabrication of high temperature superconductors which exhibits significant advantages over the corresponding prior art. Although the inventive concepts hereof have been illustrated by way of a preferred embodiment, it will be evident to those skilled in the art that adaptations and modifications may be employed without departing from the spirit or scope of the invention. Thus, for example, other forms of binders may be available to seal the porosity of the silicon carbide and thus render it efficacious for containment tubes.

The terms and expressions employed herein have been used as terms of description and not of limitation, and there is no intent in the use thereof to exclude equivalents, but on the contrary, it is intended to include any and all equivalents, adaptations and modifications that can be employed without departing from the spirit and scope of the invention as described in the specification and claims herein.

What is claimed is:

1. A method of making a high temperature superconductor comprising the steps of:
    (a) preparing a powder of ceramic superconductor materials;
    (b) selecting a confinement chamber of material essentially impervious to oxygen and non-reactive with said ceramic superconductor materials;
    (c) essentially filling said confinement chamber with said powder thereby to produce a filled confinement chamber;
    (d) sealing said confinement chamber after it has been filled to produce a filled and sealed confinement chamber essentially impervious to oxygen; and
    (e) heating said filled and sealed confinement chamber to the sintering temperature of said powder thereby to sinter said powder and form said superconductor.

2. A method of making a high temperature superconductor comprising the steps of:
    (a) preparing a powder of selected superconductor materials including yttrium, copper oxide and barium;
    (b) selecting a confinement chamber of material essentially impervious to oxygen and non-reactive with said selected superconductor materials;
    (c) essentially filling said confinement chamber with said powder thereby to produce a filled confinement chamber;
    (d) sealing said confinement chamber after it has been filled to produce a filled and sealed confinement chamber essentially impervious to oxygen; and
    (e) heating said filled and sealed confinement chamber to the sintering temperature of said powder thereby to sinter said powder and form said superconductor.

3. A method of making a high temperature superconductor comprising the steps of:
    (a) preparing a powder of ceramic superconductor materials;
    (b) selecting an essentially gas-tight oxygen impervious confinement chamber formed principally of silicon carbide material;
    (c) essentially filling said confinement chamber with said powder thereby to produce a filled confinement chamber;
    (d) sealing said confinement chamber after it has been filled to produce a filled and sealed confinement chamber; and
    (e) heating said filled and sealed confinement chamber to the sintering temperature of said powder thereby to sinter said powder and form said superconductor.

4. A method according to claim 1 further including the step of cooling said filled and sealed confinement chamber after it has been heated according to a predetermined cooling rate.

5. A method according to claim 2 further including the step of cooling said filled and sealed confinement chamber after it has been heated according to a predetermined cooling rate.

6. A method according to claim 3 further including the step of cooling said filled and sealed confinement chamber after it has been heated according to a predetermined cooling rate.

7. A method according to claim 4 further including the step of opening said sealed confinement chamber after it has been heated and cooled and removing said superconductor.

8. A method according to claim 5 further including the step of opening said sealed confinement chamber after it has been heated and cooled and removing said superconductor.

9. A method according to claim 6 further including the step of opening said sealed confinement chamber after it has been heated and cooled and removing said superconductor.

10. A method of making a high temperature superconductor comprising the steps of:

(a) compacting powder superconductor ingredients to form a first compacted powder mass;
(b) sintering said compacted powder mass to form a solid mass;
(c) grinding said solid mass to produce reformed powder;
(d) filling an essentially oxygen impervious confinement chamber with said reformed powder;
(e) compacting said reformed powder within said confinement chamber thereby to essentially fill said confinement chamber;
(f) sealing said confinement chamber after it has been essentially filled; and
(g) heating said confinement chamber after it has been essentially filled and sealed to the sintering temperature of the contents and produce said superconductor.

11. A method of making a high temperature superconductor comprising the steps of:
(a) compacting a powder of ceramic superconductor ingredients to form a first compacted powder mass;
(b) sintering said first compacted powder mass to form a first solid mass;
(c) grinding said first solid mass to produce first reformed powder;
(d) compacting said first reformed powder to form a second compacted powder mass;
(e) sintering said second compacted powder mass to form a second solid mass;
(f) grinding said second solid mass to produce a second reformed powder;
(g) filling an essentially oxygen impervious confinement chamber with said second reformed powder;
(h) compacting said second reformed powder within said confinement chamber thereby to essentially fill said confinement chamber;
(i) sealing said confinement chamber after it has been essentially filled; and
(j) heating said confinement chamber after it has been essentially filled and sealed to the sintering temperature of the contents of said confinement chamber thereby to sinter said contents and produce said superconductor.

12. A method of producing a ceramic superconducting layer on a substrate comprising:
(a) selecting the superconducting material of said ceramic superconducting layer;
(b) selecting a substrate that is non-reactive with said superconducting layer at the melting temperature of said superconducting layer;
(c) positioning a predetermined quantity of said superconducting material of said ceramic superconducting layer on a surface of said substrate;
(d) selecting an essentially oxygen impervious confinement chamber of material that is non-reactive with the superconducting material of said ceramic superconducting layer and said substrate and is capable of withstanding heating to the melting temperature of said superconducting material;
(e) positioning said substrate with said predetermined quantity of said superconducting material on said surface thereof within said confinement chamber;
(f) sealing said confinement chamber with said substrate therein; and
(g) heating at least a portion of said confinement chamber to the melting temperature of said superconducting material thereby to melt said superconducting material and form a superconducting layer on said surface.

13. A method according to claim 12 wherein said step of heating comprises progressive zone heating along a major axis of said confinement chamber.

14. A method according to claim 12 wherein said step of heating comprises heating the entire confinement chamber to said melting temperature.

15. A method of producing a ceramic superconducting layer on a substrate comprising:
(a) selecting the superconducting material of said ceramic superconducting layer;
(b) selecting a substrate that is non-reactive with said superconducting layer at the melting temperature of said superconducting layer;
(c) positioning a predetermined quantity of said superconducting material of said ceramic superconducting layer on a surface of said substrate;
(d) selecting an essentially oxygen impervious confinement chamber of predetermined volume and of material that is non-reactive with the superconducting material of said ceramic superconducting layer and said substrate and is capable of withstanding heating to the melting temperature of said superconducting material;
(e) positioning said substrate with said predetermined quantity of said superconducting material on said surface thereof within said confinement chamber;
(f) sealing said confinement chamber with said substrate therein; and
(g) heating at least a portion of said confinement chamber to the melting temperature of said superconducting material thereby to melt said superconducting material and form a superconducting layer on said surface.

16. A method of producing a ceramic superconducting layer on a silicon carbide substrate comprising:
(a) selecting the superconducting material of said ceramic superconducting layer;
(b) positioning a predetermined quantity of said superconducting material of said ceramic superconducting layer on a surface of said silicon carbide substrate;
(c) selecting a confinement chamber of essentially impervious silicon carbide;
(d) positioning said silicon carbide substrate with said predetermined quantity of said superconducting material on said surface thereof within said confinement chamber;
(e) sealing said confinement chamber with said substrate therein; and
(f) heating at least a portion of said confinement chamber to the melting temperature of said superconducting material thereby to melt said superconducting material and form a superconducting layer on said surface.

* * * * *